United States Patent [19]
Kishima et al.

[11] Patent Number: 5,898,255
[45] Date of Patent: Apr. 27, 1999

[54] PIEZOELECTRIC ACTUATOR AND METHOD FOR MANUFACTURING

[75] Inventors: Koichiro Kishima, Kanagawa; Tetsuo Nakayama, Tokyo; Takaaki Murakami, Kanagawa, all of Japan

[73] Assignee: Sony Corporation, Tokyo, Japan

[21] Appl. No.: 08/686,377

[22] Filed: Jul. 25, 1996

[30] Foreign Application Priority Data

Jul. 28, 1995 [JP] Japan .................................. 7-193365

[51] Int. Cl.⁶ .................................................. H01L 41/08
[52] U.S. Cl. .......................... 310/330; 310/363; 310/348
[58] Field of Search .................................. 310/330, 331, 310/332, 328, 358, 363, 364

[56] References Cited

U.S. PATENT DOCUMENTS

| | | | |
|---|---|---|---|
| Re. 29,009 | 10/1976 | Jeffers | 73/88.5 SD |
| 4,151,502 | 4/1979 | Kurihara et al. | 338/2 |
| 5,126,615 | 6/1992 | Takeuchi et al. | 310/330 |
| 5,376,856 | 12/1994 | Takeuchi et al. | 310/328 |
| 5,392,982 | 2/1995 | Li | 228/124.5 |

FOREIGN PATENT DOCUMENTS 0629007  12/1994  European Pat. Off. ............... 310/330

*Primary Examiner*—Mark O. Budd
*Attorney, Agent, or Firm*—Hill & Simpson

[57] ABSTRACT

A plate material 1 and piezoelectric ceramics 2 are bonded together through an alloy layer 3 formed by an alloy forming reaction due to the mutual diffusion phenomena between a liquid metal including at least galium and the plate material 1 or the piezoelectric ceramics 2, or the mutual diffusion phenomena between the liquid metal and metal powder. The alloy layer 3 may include at least one or more of indium, tin and zinc and at least one or more of copper, silver, gold, and palladium. Further, a metal may be provided on at least one of the bonded surfaces of the plate material 1 and the piezoelectric ceramics 2. This metal may include one or more of copper, silver, gold, tin and palladum. In addition, a metal layer may be formed on the bonded surface 1a side of the plate material 1. Still further, an amorphous layer may be formed on at least one of the parts between the plate material 1 and the alloy layer 3, and between the piezoelectric ceramics 2 and the alloy layer 3.

3 Claims, 6 Drawing Sheets

PIEZOELECTRIC ACTUATOR AND METHOD FOR MANUFACTURING

BACKGROUND OF THE INVENTION

1. Field of the Invention

This invention relates to a piezoelectric actuator having piezoelectric ceramics bonded onto a plate material and a method for manufacturing it, and more particularly to a piezoelectric actuator and a method for manufacuring it in which its response characteristic can be improved and its productivity can be improved by bonding the piezoelectric ceramics to the plate material based on an alloy forming reaction due to mutual diffusion phenomena.

2. Description of the Related Art

Conventionally, a piezoelectric actuator having piezoelectric ceramics formed on a plate material serves to generate on the piezoelectric ceramics the displacement which corresponds to supply voltage when voltage is supplied to the piezoelectric ceramics, so that the displacement of the piezoelectric ceramics causes the plate material to be displaced, or the deformation of the plate material is transferred to the piezoelectric ceramics, which are thus deformed, and the voltage corresponding to the displacement of the piezoelectric ceramics is generated on the piezoelectric ceramics. Such a piezoelectric actuator has been employed for a piezoelectric buzzer, an ultrasonic motor, an ink jet printer head, various kinds of sensors, etc.

There have been proposed various techniques for manufacturing a piezoelectric actuator such as a method for forming piezoelectric ceramics by providing particles in the form of paste, which become piezoelectric ceramics, on a plate material and then sintering them, and a method for bonding the sintered piezoelectric ceramics onto the plate material.

In the above mentioned method for providing the particles in the form of paste, which become piezoelectric ceramics, on the plate material and then sintering them, an electrode composed of conductive and heat resistant material such as platinum or palladium is formed on the plate material composed of ceramics or the like, which are a high-melting point material, and then, pasted particles which become piezoelectric ceramics are provided on the electrode material, are sintered while holding them at the temperature of about 1000° C. and the piezoelectric ceramics are formed on the plate material so that a piezoelectric actuator is manufactured.

As techniques for bonding the sintered piezoelectric ceramics onto the plate material, as disclosed in Japanese examined patent publication No. 64-87675, a method has been known in which the piezoelectric ceramics are bonded under pressure to the plate material made of metal by means of an adhesive agent produced by mixing metal powder of good conductivity with epoxy resin, acrylic resin, urethane resin, phenol resin or cyanoacrylate resin. Further, a method has been also known, as disclosed in Japanese patent laid-open publication No. 62-277900, in which glass paste is applied to the surface of the plate material made of metal, the piezoelectric ceramics are provided thereon, and the glass paste is heated under the temperature of 460 to 600° C. so that the piezoelectric ceramics are bonded to the plate material made of metal.

When the piezoelectric actuator is manufactured in accordance with the method that the pasted particles, which serve as the piezoelectric ceramics, are provided on the above described plate material and then sintered, they are sintered under the temperature of approximately 1000° C., so that materials used for the plate material and the electrode are disadvatageously restricted.

Particularly, since the property of the plate material such as heat resistant temperature and coefficient of thermal expansion is greatly restricted, there have been found such problems that the material can be hardly selected freely and productivity is not good.

On the other hand, when the piezoelectric actuator is manufactured in accordance with the method that the sintered piezoelectric ceramics are bonded to the plate material, the piezoelectric ceramics do not need to be sintered after the piezoelectric ceramics are bonded to the plate material, so that the materials used for the plate material are not limited upon their selection. However, when the piezoelectric ceramics are bonded to the plate material so that the obtained product is employed as the piezoelectric actuator, they need to be strongly bonded to each other. Therefore, they must be bonded together in accordance with the above described means, that is, the above mentioned adhesive agent is used, or the glass paste is used.

However, since a resin exists in a bonding layer in accordance with the method in which the piezoelectric ceramics are bonded to the plate material by means of the adhesive agent, the bonding layer absorbs the displacement generated in the piezoelectric ceramics, which results in undesired deterioration in responsiveness. Specifically, in the case of high frequency oscillation, the absorption of the displacement is increased and the feature of the piezoelectric actuator is thus deteriorated. On the other hand, when the glass paste is used, a bonding layer between the piezoelectric ceramics and the plate material is composed of a glass material, so that the displacement of the piezoelectric ceramics absorbed by the bonding layer is lowered. However, since a heating process for heating the glass material is needed, a limitation is disadvantageously subjected to the property of materials used such as heat resistant temperaturte, coefficient of thermal expansion. Therefore, the degree of freedom for selecting materials is undesirably reduced and productivity is lowered.

OBJECT AND SUMMARY OF THE INVENTION

Accordingly, the present invention was proposed by considering the conventional drawbacks. An object of the present invention is to provide a piezoelectric actuator excellent in its response characteristic and its productivity and a method for manufacturing it.

In order to achieve the above mentioned object, the inventiors of the invention have eagerly studied and, as a result, found that, piezoelectric ceramics are bonded to a plate material under an alloy forming reaction due to the mutual diffusion phenomena of a liquid metal including at least galium and a metal material by employing an occurrence that the liquid metal including galium reacts to the metal material to form an alloy by virtue of the mutual diffusion phenomena, so that a piezoelectric actuator good in its responsiveness and its productivity can be manufactured, because a resin is not present between the plate material and the piezoelectric ceramics and a heating process is not needed.

Specifically stated, in accordance with one aspect of the present invention, there is provided a piezoelectric actuator having piezoelectric ceramics bonded onto a plate material, in which the piezoelectric ceramics are bonded to the plate material through an alloy layer having at least galium provided therebetween.

Further, in accordance with another aspect of the present invention, there is provided a method for manufacturing the above mentioned piezoelectric actuator comprising the steps of applying a liquid metal including at least galium to at least one of a plate material and piezoelectric ceramics, laminating the piezoelectric ceramics on the plate material while sandwiching the liquid metal therebetween and generating an alloy forming reaction due to the mutual diffusion phenomena on at least one of parts between the bonded surface side of the plate material and the liquid metal and between the bonded surface side of the piezoelectric ceramics and the liquid metal so that the piezoelectric ceramics are bonded to the plate material through an alloy layer.

Further, in accordance with still another aspect of the present invention, there is provided a method for manufacturing a piezoelectric actuator in which an alloy material produced by mixing and stirring a liquid metal including at least galium with metal powder including at least one or more of silver, copper, tin, gold and palladium, in place of the liquid metal used in the above mentioned method, and an alloy forming reaction due to the mutual diffusion phenomena between the liquid metal and the metal powder in the alloy material is generated so that the piezoelectric ceramics are bonded to the plate material through an alloy layer.

DESCRIPTION OF THE PREFERRED EMBODIMENTS

Referring to the accompanying drawings, the embodiments of the present invention will be described in more detail.

Figure 1:
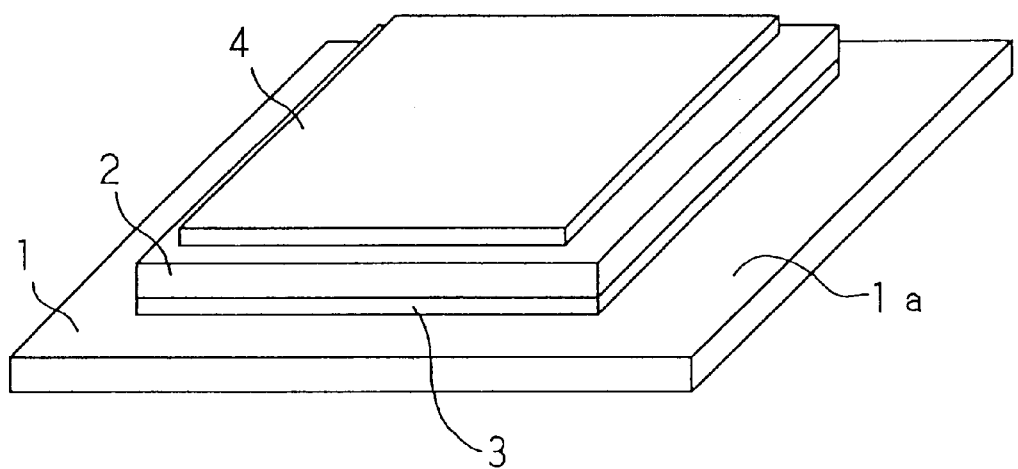
FIG. 1 is a schemamtic perspective view showing main parts of an embodiment of a piezoelectric actuator according to the present invention.

A piezoelectric actuator according to the present invention, as illustrated in FIG. 1, piezoelectric ceramics 2 are provided on a plate material 1 and the piezoelectric ceramics 2 are bonded to the plate material 1 through an alloy layer 3 including at least galium. At least the bonded surface 1a side of the plate material 1 is formed with a conductive material so that voltage can be applied to the piezoelectric ceramics 2 on which an electrode 4 is formed.

That is, the above described piezoelectric actuator comprises a plate material 1 on which an alloy layer 3, piezoelectric ceramics 2 and an electrode 4 are sequentially laminated.

Figure 2:
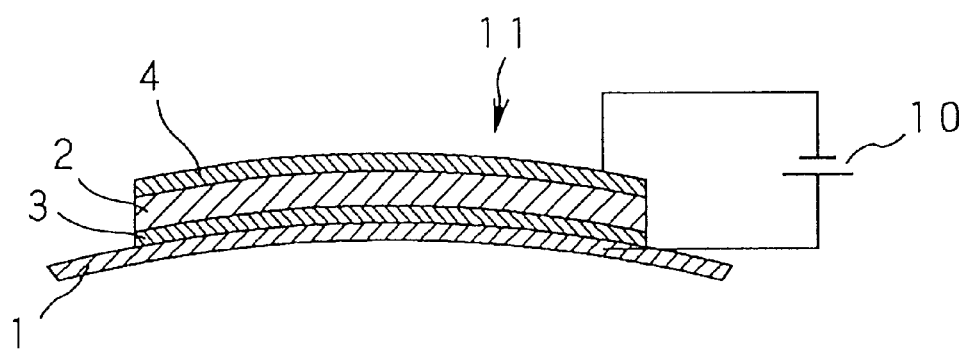
FIG. 2 is a sectional view diagrammatically showing the present embodiment of the piezoelectric actuator of the invention to which voltage is supplied.

Accordingly, in the piezoelectric actuator having the above mentioned structure, when voltage is supplied to the piezoelectric ceramics 2 from a power source 10 through the electrode 4 provided on the piezoelectric ceramics 2 and the conductive material on the plate material serving as an electrode, as illustrated in FIG. 2, displacement occurs on the piezoelectric ceramics 2 and similar displacement also takes place simultaneously on the plate material 1, so that the displacement corresponding to the supply voltage occurs on the entire body of the piezoelectric actuator 11.

At this time, in the piezoelectric actuator 11 according to the present invention, since the plate material 1 is strongly connected to the piezoelectrc ceramics 2 through the alloy layer 3, the displcement of the piezoelectric ceramics 2 is hardly absorbed by a bonding part, an excellent response characteristic can be obtained and the displacement corresponding to the supply voltage can be obtained within a range of voltage, which is wider than that when the piezoelectric ceramics are bonded to the plate material by means of an adhesive agent including resin. Therefore, when the present invention is applied to an actuator, improved properties can be realized.

In addition, as mentioned above, since the displacement of the piezoelectric ceramics is hardly absorbed by the bonding layer, smaller actuators can be realized in various kinds of applications which need the same displacement or force. In other words, when the above mentioned piezoelectric actuator 11 is applied to an ink jet printer head or the like, the small actuator enables nozzle pitches to become highly compact and further the ink jet printer head to be more compact.

Further, when high frequency voltage is supplied to the piezoelectric ceramics, since the quantity of absorption of the displacement on the piezoelectric ceramics by the bonding layer is also lowered, high frequency oscillation can be obtained, so that the piezoelectric actuator excellent in its frequency response characteristic can be realized. That is, when the above described piezoelectric actuator 11 is used for a piezoelectric buzzer or an ultrasonic motor or the like, the frequency response range of the piezoelectric buzzer and the speed range of the ultrasonic motor can be increased by employing its excellent frequency response charactersitic.

Figure 3:
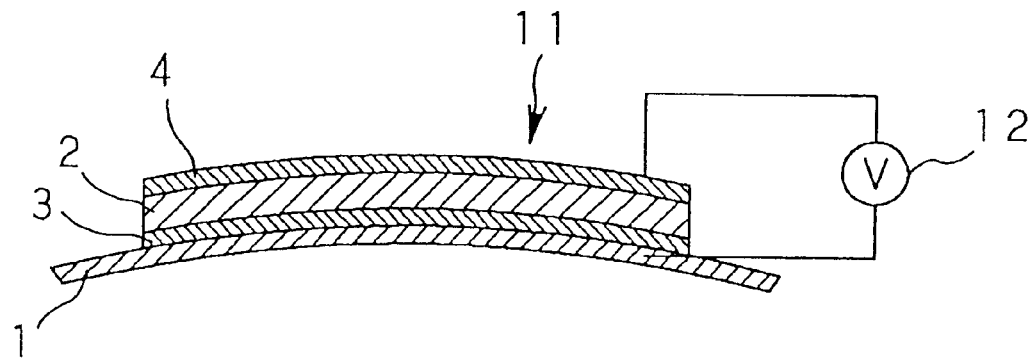
FIG. 3 is a sectional view diagrammatically illustrating the embodiment of the piezoelectric actuator of the invention used as a sensor.

Additionally stated, the piezoelectric actuator mentioned above is usable as a sensor. When it is used as the sensor, a voltmeter 12 is connected to the electrode 4 provided on the piezoelectric ceramics 2 and to the conductive material on the plate material 1 as the electrode, as shown in FIG. 3, so that voltage generated owing to the displacement of the piezoelectric actuator 11 may be monitored.

At this time, in the piezoelectric actuator 11, since the piezoelectric ceramics 2 are, as mentioned above, firmly bonded to the plate material 1 through the alloy layer 3, it is difficult to absorb the displacement of the piezoelectric ceramics 2 by the bonding part and the response characteristic is excellent, the voltage corresponding to the displacement can be obtained within a range of displacement wider than that when the piezoelectric ceramics are bonded to the plate material by means of the adhesive agent including resin. Therefore, when the piezoelectric actuator 11 is employed for a sensor, it exhibits good capability.

Now, a method for manufacturing the piezoelectric actuator as mentioned above will be described hereinafter.

Figure 4:
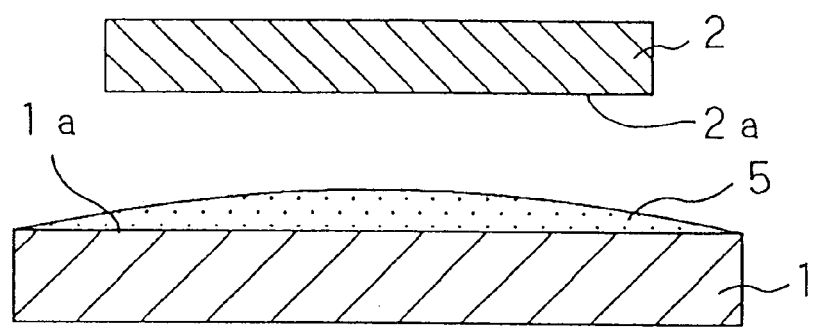
FIG. 4 is a sectional view showing a step of applying a liquid metal to a plate material, in order of steps of an embodiment of a method for manufacturing a piezoelectric actuator according to the invention.

In order to form such a piezoelectric actuator, a liquid metal 5 including at least galium as a main component is initially applied, as seen in FIG. 4, to at least one of the bonded surface 1a of the plate material 1 and the bonded surface 2a of the piezoelectrci ceramics 2. FIG. 4 shows an example that the liquid metal is applied only to the bonded surface 1a of the plate material 1.

The liquid metal 5 preferably includes at least one or more of indium, tin, and zinc in addition to galium. Further, the liquid material 5 is preferably liquid at an operating temperature because of its good operability. Specifically, the liquid metal has preferably a composition of 40 to 95% of galium, 0 to 40% of indium, 0 to 30% of tin and 0 to 10% of zinc. The liquid metal 5 may include only galium. However, the melting point of this liquid metal is undesirably raised and this liquid metal cannot be treated as liquid under room temperature, and therefore, it is not preferable. Accordingly, as described above, the liquid metal preferably includes other metals so that its melting point is lowered and it can be treated as liquid under room temperature.

In addition, a material, which can form an alloy under the mutual diffusion phenomena with the above mentioned liquid metal 5, is preferably provided on at least one of the bonded surface 1a side of the plate material 1 and the bonded surface 2a side of the piezoelectric ceramics 2. As such a material, metals may be used. These metal materials, except aluminium whose reaction is too active, may preferably include one or more of copper, gold, silver, tin and palladium in order to raise a melting point after the formation of an alloy and further stimulate the formation of an alloy.

Therefore, a laminated material in which a metal layer is formed on the bonded surface 1a or 2a side may be employed as the plate material 1 or the piezoelectric ceramics 2. As the plate material 1, the laminated material formed by laminating the metal layer on the bonded surface 1a side is preferably used.

Further, the liquid metal 5 may possibly form a small quantity of non-conductor on its surface, so that the wettability of the plate material 1 or the piezoelectric ceramics 2 relative to the liquid metal 5 is sometimes lowered during the application step of this liquid metal.

In this way, when the wettability is deteriorated, the bonded surface 1a or 2a to which the liquid metal 5 is applied may be subjected to a degasification process, or the bonded surfaces 1a and 2a after the application of the liquid metal may be rubbed together so that the non-conducting layer is broken and the wettability is improved.

Figure 5:
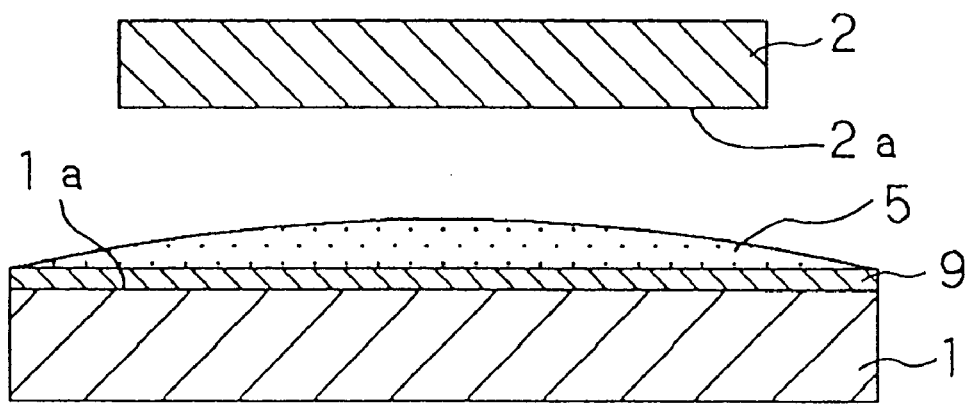
FIG. 5 is a sectional view showing a step of forming an amorphous layer on the plate material in the present embodiment of the method according to the invention.

Additionally, the bonded surface 1a of the plate material 1 or the bonded surface 2a of the piezoelectric ceramics 2 is coated with a material having a good wettability relative to the non-conducting layer so that the wettability can be improved. Namely, as illustrated in FIG. 5, an amorphous layer 9 is formed on at least one of the bonded surface 1a of the plate material 1 or the bonded surface 2a of the piezoelectric ceramics 2 (In FIG. 5, an example is shown in which the amorphous layer 9 is formed only on the bonded surface 1a of the plate material 1.), so that the wettability of the plate material or the piezoelectric ceramics can be improved. A silicon oxide film, an ITO film or the like may be employed as the amorphous layer 9 and its thickness is preferably smaller that 1 $\mu$m, and further smaller than 0.1 $\mu$m, because an excessively thick layer may possibly prevent an alloy froming reaction in a post-step.

If the wettability is improved in this manner, the production yield of the piezoelectric actuator during its production can be improved and its productivity can be improved.

Figure 6:
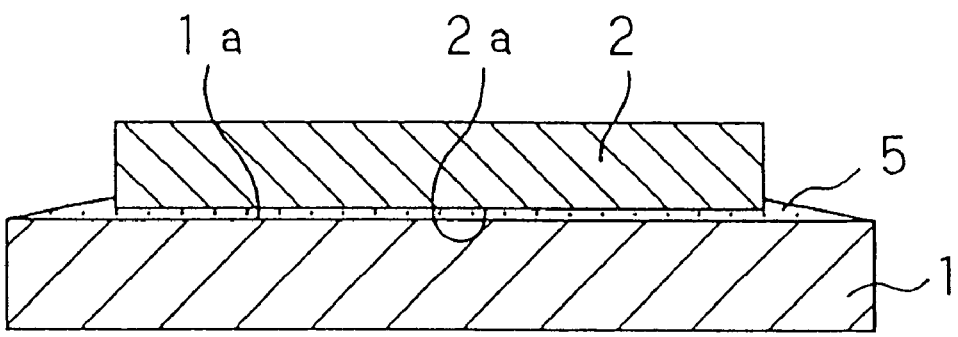
FIG. 6 is a sectional view showing a step of laminating piezoelectric ceramics on the plate material while sandwiching the liquid metal therebetween, in order of steps of the embodiment of the method according to the invention.

Next, the piezoelectric ceramics 2 are laminated on the plate material 1 with the liquid metal 5 sandwiched therebetween so as to oppose the bonded surface 1a to the bonded surface 2a and the thickness of the liquid metal 5 is thinned, as illustrated in FIG. 6. As techniques for thinning the thickness of the liquid metal as mentioned above, a method for entirely pressing the plate material 1 and the piezoelectric ceramics 2, or a method for gradually pressing them by means of a roller or the like may be enumerated. In this case, when it is determined that the thickness of the liquid metal 5 is smaller than 10 $\mu$m by employing a screen printing method or the like during the application of the liquid metal 5 to the plate material or the piezoelectric ceramics, the pressing operation is not so required.

Figure 7:
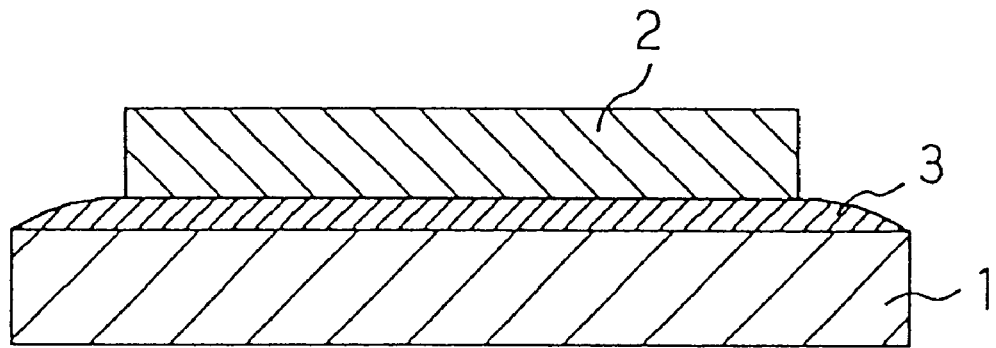
FIG. 7 is a sectional view showing a step of bonding the piezoelectric ceramics to the plate material through an alloy layer, in order of steps of the embodiment of the method according to the present invention.

Then, while the laminated product is held under this state, an alloy forming reaction due to the mutual diffusion phenomena is caused on at least one of the parts between the bonded surface 1a side of the plate material 1 and the liquid metal 5, and the bonded surface 2a side of the piezoelectric ceramics 2 and the liquid metal 5. Thus, as illustrated in FIG. 7, the piezoelectrcic ceramics 2 are strongly bonded to the plate material 1 through the alloy layer 3.

Herein, when the plate material 1, which had a metal layer made of copper with thickness of 10 $\mu$m formed on the bonded surface 1a side, was used, the piezoelectric ceramics 2 having a gold-palladium alloy with thickness of 3 $\mu$m provided on the bonded surface 2a side was used, a eutectic alloy (its melting point is about 5° C.) respectively including 65.0% of galium, 18.95% of indium and 15.0% of tin was used as the liquid metal 5, and the thickness of the liquid metal 5 was 1 $\mu$m, a strong alloy was formed after they were left alone for 24 hours. In addition, time required for an alloy formation could be shortened by heating them while they were left alone as described above.

Figure 8:
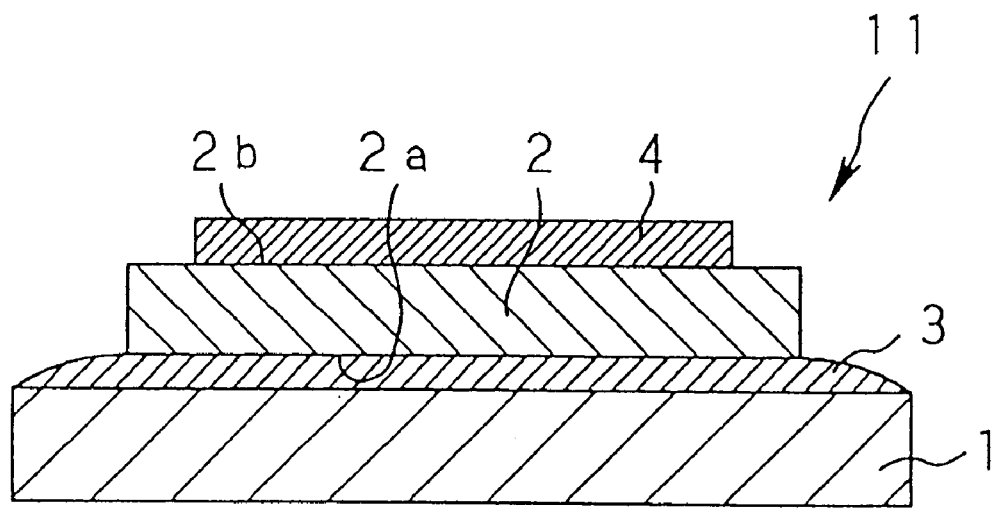
FIG. 8 is a sectional view showing a step of forming an electrode on the piezoelectric ceramics, in order of steps of the embodiment of the method according to the present invention.

Finally, as shown in FIG. 8, the electrode 4 is formed on a main surface 2b opposed to the bonded surface 2a of the piezoelectric ceramics 2 so that the piezoelectric actuator 11 is completed. In this case, the electrode 4 does not need to be formed after the forming step of the alloy layer 3 and may be previously formed on the piezoelectric ceramics.

Another method for manufacturing the above mentioned piezoelecric actuator will be now described in the following.

Figure 9:
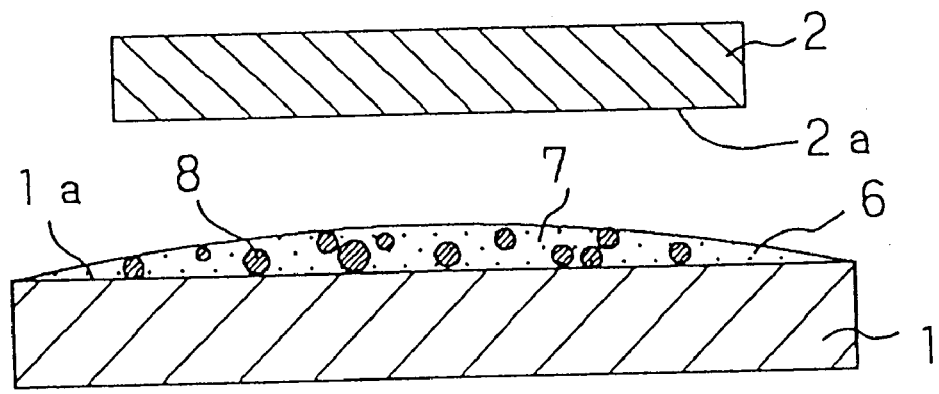
FIG. 9 is a sectional view showing a step of applying an alloy material to a plate material, in order of steps of another embodiment of a method for manufacturing a piezoelectric actuator according to the present invention.

In order to form such a piezoelectric actuator, an alloy material 6 obtained by mixing and stirring a liquid metal 7 including at least galium as a main component with metal powder 8 including at least one of silver, copper, tin, gold and palladium is initially applied, as seen in FIG. 9, to at least one of the bonded surface 1a of the plate material 1 and the bonded surface 2a of the piezoelectric ceramics 2. FIG.

9 shows an example that the liquid metal is applied only to the bonded surface 1a of the plate material 1.

The liquid metal 7 preferably includes at least one or more of indium, tin, and zinc in addition to galium. Further, the liquid material 5 is preferably liquid at an operating temperature because of its good operability. Specifically, the liquid metal has preferably a composition of 40 to 95% of galium, 0 to 40% of indium, 0 to 30% of tin and 0 to 10% of zinc.

Further, the particle size of the metal powder 8 may be 1 to 40 $\mu$m. Since the thickness of a bonding layer depends on the maximum particle size of the metal powder 8, if the desired value of thickness of the bonding layer is smaller than about 15 $\mu$m, the maximum paticle size of the metal powder is preferably set to about 10 $\mu$m.

The mixing ratio of the liquid metal 7 to the metal powder 8 in the above described alloy material 6 must be located within a range where a good adhesive property can be maintained, since the piezoelectric ceramics 2 need to be bonded to the plate material 1 after the alloy forming reaction is finished. The mixing ratio of the metal powder 8 to the liquid metal 7 is limited.

In addition, a material, which can form an alloy under the mutual diffusion phenomena with the above mentioned liquid metal 7, is preferably provided on at least one of the bonded surface 1a side of the plate material 1 and the bonded surface 2a side of the piezoelectric ceramics 2. As such a material, metals may be used. These metal materials, except aluminium whose reaction is too active, may preferably include one or more of copper, gold, silver, tin and palladium in order to raise a melting point after the formation of an alloy and further stimulate the formation of an alloy.

Therefore, a laminated material in which a metal layer is formed on the bonded surface 1a or 2a side may be employed as the plate material 1 or the piezoelectric ceramics 2. As the plate material 1, the laminated material formed by laminating the metal layer on the bonded surface 1a side, is preferably used.

According to this manufacturing method, the liquid metal 7 reacts on the metal powder 8 in the alloy material 6 to produce an alloy which serves as an adhesive agent, so that the alloy forming reaction between the liquid metal 7 and the plate material 1, and the piezoelectric ceramics 2 is not necessarily required.

Further, the alloy material 6 comprising the liquid metal 7 and the metal powder 8 may possibly form a small quantity of non-conductor on its surface in air,so that the wettability of the plate material 1 or the piezoelectric ceramics 2 relative to the alloy matrial 6 is sometimes lowered during the application step of this alloy material 6 to the material 1 and the ceramics 2.

In this way, when the wettability is deteriorated, the bonded surface 1a or 2a to which the alloy material 6 is applied may be subjected to a degasification process, or the bonded surfaces 1a and 2a may be rubbed together after the application of the alloy material thereto so that the non-conducting layer is broken and their wettability is improved.

Figure 10:
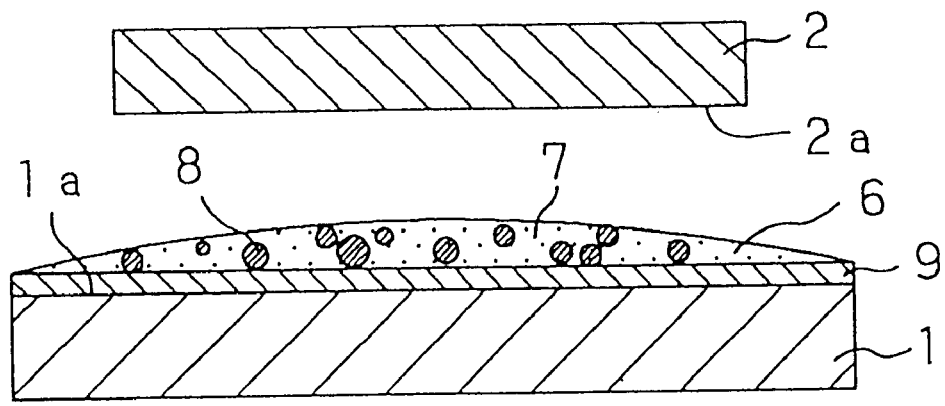
FIG. 10 is a sectional view showing a step of forming an amorphous layer on the plate material in the embodiment of the method according to the present invention.

Additionally, the bonded surface 1a of the plate material 1 or the bonded surface 2a of the piezoelectric ceramics 2 is coated with a material having a good wettability relative to the non-conducting layer so that its wettability can be improved. Namely, as illustrated in FIG. 10, an amorphous layer 9 is formed on at least one of the bonded surface 1a of the plate material 1 or the bonded surface 2a of the piezoelectric ceramics 2 (In FIG. 10, an example is shown in which the amorphous layer 9 is formed only on the bonded surface 1a of the plate material 1.), so that the wettability of the plate material or the piezoelectric ceramics can be improved. A silicon oxide film, an ITO film or the like may be employed as the amorphous layer 9 and its thickness is preferably smaller that 1 $\mu$m, and further smaller than 0.1 $\mu$m, because an excessively thick layer may possibly prevent an alloy froming reaction in a post-step.

If the wettability is improved in this manner, the production yield of the piezoelectric actuator during its production can be improved and its productivity can be improved.

Figure 11:
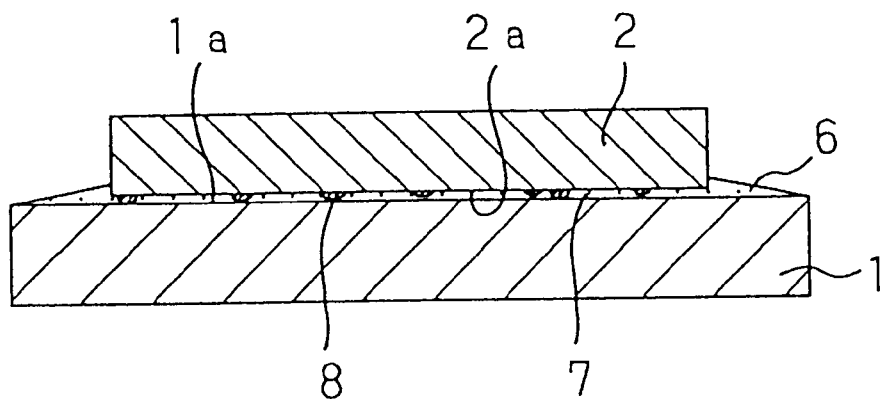
FIG. 11 is a sectional view showing a step of laminating piezoelectric ceramics on the plate material while sandwiching an alloy material therebetween, in order of steps of the embodiment of the method according to the present invention.

Next, the piezoelectric ceramics 2 are laminated on the plate material 1 with the alloy material 6 sandwiched therebetween so as to oppose the bonded surface 1a to the bonded surface 2a and the thickness of the alloy material 6 is thinned, as illustrated in FIG. 11. As techniques for thinning the thickness of the alloy material as mentioned above, a method for entirely pressing the plate material 1 and the piezoelectric ceramics 2 , or a method for gradually pressing them by means of a roller or the like may be enumerated. In this case, when it is determined that the thickness of the liquid metal 5 is smaller than 10 $\mu$m by employing a screen printing method or the like during the application of the alloy material 6 to the plate material or the piezoelectric ceramics, the pressing operation is not so required.

Then, while the laminated product is held under this state, an alloy forming reaction due to the mutual diffusion phenomena is caused between the liquid metal 7 and the metal powder 8 in the alloy material 6. Thus, as illustrated in FIG. 7, the piezoelectric ceramics 2 are strongly bonded to the plate material 1 through the alloy layer 3. Further, when a metal is provided on the bonded surface 1a side of the plate material 1 or the bonded surface 2a side of the piezoelectric ceramics 2, the alloy forming reaction is caused between the bonded surface 1a side of the plate material 1 and the alloy material 6 or between the bonded surface 2a side of the piezoelectric ceramics 2 and the alloy material 6. Herein, the plate material 1, which had a metal layer made of copper with thickness of 10 $\mu$m formed on the bonded surface 1a side, was used. The piezoelectric ceramics 2 having a gold-palladium alloy with thickness of 3 $\mu$m provided on the bonded surface 2a side was used. A eutectic alloy (its melting point is about 5° C.) respectively including 65.0% of galium, 18.95% of indium and 15.0% of tin was used as the liquid metal 7. An alloy respectively including 50.0% of silver, 25.7% of tin, 15.0% of copper, 9.0% of palladium and 0.3% of gold and having the maximum particle size of 20 $\mu$m was used as the metal powder 8, and the weight of the liquid metal 7 was 1.7 times as much as that of the metal powder 8, As a result, the thickness of the bonding layer was approximately 30 $\mu$m and a strong alloy was formed after they were left alone for 4 hours. In addition, time required for an alloy formation could be shortened by heating them while they were left alone as described above.

Further, a glass material with the surface roughness of about 1 to 2 $\mu$m was used as the plate material 1. The piezoelectric ceramics 2 having a gold-palladium alloy with thickness of 3 $\mu$m provided on the bonded surface 2a side was used. A eutectic alloy (its melting point is about 5° C.) respectively including 65.0% of galium, 18.95% of indium and 15.0% of tin was used as the liquid metal 7. An alloy respectively including 50.0% of silver, 27.5% of tin, 15.0% of copper, 9.0% of palladium and 0.3% of gold and having the maximum particle size of about 20 $\mu$m was used as the metal powder 8 and the weight of the liquid metal 7 was 1.7 times as much as that of the metal powder 8. As a result, the thickness of the bonding layer became about 30 μm and a strong alloy was formed after they were left alone for 4 hours. In addition, time required for an alloy formation could be shortened by heating them while they were left alone as described above.

Finally, as shown in FIG. 8, the electrode 4 is formed on a main surface 2b opposed to the bonded surface 2a of the piezoelectric ceramics 2 so that the piezoelectric actuator 11 is completed. In this case, the electrode 4 does not need to be formed after the forming step of the alloy layer 3 and may be previously formed on the piezoelectric ceramics.

Therefore, as stated above, with the method for manufacturing the piezoelectric actuator according to the present invention, the heating step is not needed, the selectivity for the plate materials or electrode materials can be increased and the productivity can be thus improved.

Figure 12:
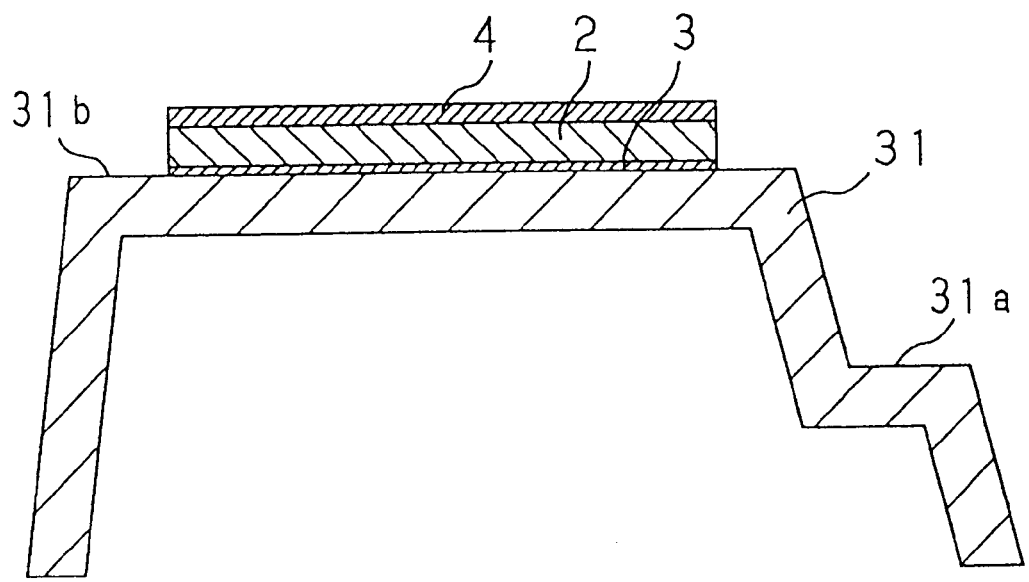
FIG. 12 is a schematically sectional view showing main parts of another embodiment of a piezoelectric actuator according to the present invention.

If the piezoelectric actuator is manufactured in accordance with the above mentioned method, a large piezoelectric actuator having such a configuration as illustrated in FIG. 12 can be readily manufactured.

In this actuator shown in FIG. 12, a plate material 31 formed in a U-shape in section is used and it has a step part 31a on one side surface thereof. Piezoelectric ceramics material 2 is provided on a flat part 31b as a bottom surface of the plate material 31. The piezoelectric ceramics material 2 is bonded to the plate material 31 through an alloy layer 3 provided therebetween.

In the conventional method for manufacturing a piezoelectric actuator, it has been difficult to manufacture the large piezoelectric actuator with such a configuration, because the heating step has been required and it has been necessary to put this piezoelectric actuator in a furnace. However, according to the manufacturing method for the piezoelectric actuator of the invention, such a large piezoelectric actuator can be easily formed.

Further, according to the method for manufacturing the piezoelectric actuator of the present invention, a piezoelectric actuator with high performance which employs a metal plate having a complicated configuration formed with a sheet metal or the like as a metal material can be manufactured without difficulty.

As readily understood from the above description, according to the piezoelectric actuator of the invention, since the alloy layer composed of an inorganic material is employed to bond the piezoelectric ceramics to the plate material, the displacement of the piezoelectric ceramics is hardly absorbed by the bonding part, and the piezoelectric actuator is improved in its response characteristic and can meet a wide range of voltage. Since the displacement of the piezoelectric ceramics is hardly absorbed by the bonding part in this way, a more compact piezoelectric actuator than a conventional one can be realized when a prescribed displacement or force is required.

Further, according to the method for manufacturing a piezoelectric actuator of the invention, since the plate material and the piezoelectric ceramics are bonded together by employing an alloy forming reaction due to the mutual diffusion phenomena between the bonded surface side of the plate material and the liquid metal including at least galium or between the bonded surface side of the piezoelectric ceramics and the liquid metal, or due to the mutual diffusion phenomena between the liquid metal including at least galium in the alloy material and the metal powder including at least one or more of silver, copper, tin, gold and palladium, the heating step is not required. Therefore, the selectivity for the plate materials or electrode materials is increased and the productivity of the piezoelectre actuator is improved.

As mentioned above, since the plate material and the piezoelectric ceramics are bonded together based on an alloy forming reaction due to the mutual diffusion phenomena between the liquid metal and the metal powder, a piezoelectric actuator in which they are strongly bonded together can be manufactured, even when the plate material and the piezoelectric ceramics are formed with materials which do not generate an alloy forming reaction to the liquid metal.

Furthermore, if an amorphous layer is formed on at least one of parts between the plate material and the alloy layer and between the piezoelectric ceramics and the alloy layer, and then, the wettability of the plate material or the piezoelectric ceramics relative to the liquid metal is improved, the production yield of the piezoelectric actuator during its production is improvedd and its productivity is improved.

What is claimed is:

1. A piezoelectric actuator, comprising:
   a plate material;
   piezoelectric ceramics bonded to the plate material;
   an alloy layer including at least gallium provided between the plate material and the piezoelectric ceramics; and
   an amorphous layer formed on at least one of the parts between the plate material and the alloy layer, and between the piezoelectric ceramics and the alloy layer.

2. A piezoelectric actuator, comprising:
   a plate material made of glass whose bonded surface has a surface roughness of 1 to 2 μm;
   piezoelectric ceramics bonded to the plate material; and
   an alloy layer including at least gallium provided between the plate material and the piezoelectric ceramics.

3. A piezoelectric actuator according to claim 1, wherein said amorphous layer is composed of at least one of a silicon oxide layer and an ITO layer.

* * * * *